US010396247B2

United States Patent
Kim et al.

(10) Patent No.: US 10,396,247 B2
(45) Date of Patent: Aug. 27, 2019

(54) LIGHT-EMITTING DEVICE PACKAGE

(71) Applicant: LG INNOTEK CO., LTD., Seoul (KR)

(72) Inventors: Byung Mok Kim, Seoul (KR); Hiroshi Kodaira, Seoul (KR); Baek Jun Kim, Seoul (KR); Ha Na Kim, Seoul (KR); Jung Woo Lee, Seoul (KR); Sang Ung Hwang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 125 days.

(21) Appl. No.: 15/319,486

(22) PCT Filed: Jun. 8, 2015

(86) PCT No.: PCT/KR2015/005690
§ 371 (c)(1),
(2) Date: Dec. 16, 2016

(87) PCT Pub. No.: WO2015/194779
PCT Pub. Date: Dec. 23, 2015

(65) Prior Publication Data
US 2017/0324003 A1 Nov. 9, 2017

(30) Foreign Application Priority Data
Jun. 18, 2014 (KR) .................. 10-2014-0074102

(51) Int. Cl.
*H01L 33/48* (2010.01)
*H01L 33/60* (2010.01)
(Continued)

(52) U.S. Cl.
CPC .......... *H01L 33/387* (2013.01); *H01L 33/486* (2013.01); *H01L 33/60* (2013.01);
(Continued)

(58) Field of Classification Search
CPC ... H01L 23/3107; H01L 25/167; H01L 33/10; H01L 2924/181; H01L 33/387;
(Continued)

(56) References Cited

U.S. PATENT DOCUMENTS 5,298,768 A * 3/1994 Okazaki ................ H01L 33/486
257/100
6,869,813 B2 * 3/2005 Okazaki ................ H01L 24/97
257/676
(Continued)

FOREIGN PATENT DOCUMENTS

CN 201812814 U 4/2011
CN 201812815 U 4/2011
(Continued)

OTHER PUBLICATIONS

Partial Supplementary Chinese Office Action issued in Application No. 201580032977.4 dated May 9, 2018.

*Primary Examiner* — Mary A Wilczewski
(74) *Attorney, Agent, or Firm* — Birch, Stewart, Kolasch & Birch, LLP

(57) ABSTRACT

A light-emitting device package of the embodiments includes a package body; at least one light emitting device above the package body; an adhesive layer between the at least one light emitting device and the package body; and an adhesive-layer-accommodating portion disposed in the package body for accommodating the adhesive layer therein, wherein the adhesive-layer-accommodating portion has a side surface disposed to be inclined at a predetermined angle relative to an imaginary vertical plane that extends in a thickness direction of the package body.

17 Claims, 6 Drawing Sheets

(51) Int. Cl.
*H01L 33/38* (2010.01)
*H05K 1/02* (2006.01)
*F21V 7/05* (2006.01)
*H01L 51/00* (2006.01)

(52) U.S. Cl.
CPC .............. *H05K 1/0212* (2013.01); *F21V 7/05* (2013.01); *H01L 51/0076* (2013.01); *H01L 2224/48091* (2013.01); *H01L 2224/73265* (2013.01); *H01L 2933/0033* (2013.01)

(58) Field of Classification Search
CPC ....... H01L 33/405; H01L 33/42; H01L 33/44; H01L 33/48; H01L 33/486; H01L 33/50; H01L 33/52; H01L 33/54; H01L 33/58; H01L 33/62; H01L 33/20; H01L 33/641; H01L 33/507; H01L 33/60; H01L 33/642; H01L 51/0076; H01L 33/483; H01L 2933/0033; H01L 2924/00014; H01L 2224/48091; H01L 2224/73265; F21V 7/0041; F21V 7/05; H05K 1/0212
See application file for complete search history.

(56) References Cited

U.S. PATENT DOCUMENTS

| | | | | |
|---|---|---|---|---|
| 7,294,856 B2* | 11/2007 | Ito | ....................... | H01L 27/3246 257/13 |
| 7,329,942 B2* | 2/2008 | Tsou | ....................... | H01L 24/73 257/113 |
| 7,795,809 B2* | 9/2010 | Ito | ....................... | H01L 27/3246 257/79 |
| 8,476,662 B2* | 7/2013 | Park | ....................... | H01L 24/48 257/98 |
| 8,592,855 B2* | 11/2013 | Kim | ....................... | H01L 33/486 257/433 |
| 8,766,281 B2* | 7/2014 | Kao | ....................... | H01L 33/385 257/79 |
| 9,653,526 B2* | 5/2017 | Li | ....................... | H01L 27/3246 |
| 2003/0168720 A1* | 9/2003 | Kamada | ....................... | B29C 45/14655 257/666 |
| 2005/0227569 A1* | 10/2005 | Maeda | ....................... | C09K 11/025 445/25 |
| 2006/0102917 A1* | 5/2006 | Oyama | ....................... | H01L 33/60 257/99 |
| 2006/0147746 A1* | 7/2006 | Wakako | ....................... | H01L 33/60 428/627 |
| 2007/0181900 A1* | 8/2007 | Sato | ....................... | H01L 33/60 257/99 |
| 2009/0200570 A1* | 8/2009 | Mori | ....................... | H01L 33/642 257/99 |
| 2010/0078668 A1* | 4/2010 | Kim | ....................... | H01L 33/486 257/98 |
| 2011/0079802 A1 | 4/2011 | Ng et al. | | |
| 2011/0210359 A1* | 9/2011 | Park | ....................... | H01L 33/0079 257/98 |
| 2012/0126280 A1* | 5/2012 | Lee | ....................... | H01L 33/642 257/99 |
| 2013/0214319 A1* | 8/2013 | Lee | ....................... | H01L 33/52 257/99 |
| 2014/0117396 A1* | 5/2014 | Eisert | ....................... | H01L 33/44 257/98 |
| 2014/0191253 A1* | 7/2014 | Haslbeck | ....................... | H01L 31/0203 257/82 |
| 2014/0225147 A1* | 8/2014 | Halbritter | ....................... | H01L 33/58 257/98 |
| 2014/0363915 A1* | 12/2014 | Tsai | ....................... | G03F 7/0382 438/46 |
| 2014/0367692 A1* | 12/2014 | Chang | ....................... | H01L 33/007 257/76 |
| 2015/0226839 A1* | 8/2015 | Brandl | ....................... | H01L 25/167 250/221 |

FOREIGN PATENT DOCUMENTS

| | | | | |
|---|---|---|---|---|
| CN | 102779932 A | | 11/2012 | |
| CN | 102881685 A | | 1/2013 | |
| CN | 103574387 A | * | 2/2014 | |
| CN | 203585905 U | | 5/2014 | |
| JP | 10-151794 A | | 6/1998 | |
| JP | 2005-174998 A | | 6/2005 | |
| JP | 2005174998 A | * | 6/2005 | |
| JP | 3905078 B2 | | 4/2007 | |
| JP | 2011-129854 A | | 6/2011 | |
| KR | 10-2010-0018929 A | | 2/2010 | |
| KR | 10-2013-0023536 A | | 3/2013 | |
| KR | 10-2013-0026308 A | | 3/2013 | |
| KR | 20130026308 A | * | 3/2013 | ............ H01L 24/32 |
| KR | 10-2014-0057805 A | | 5/2014 | |

* cited by examiner

[FIG. 1]
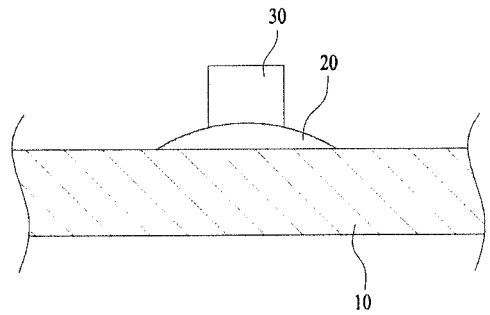
[FIG. 2a]
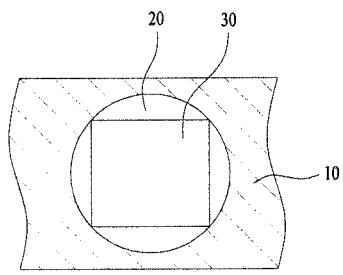
[FIG. 2b]
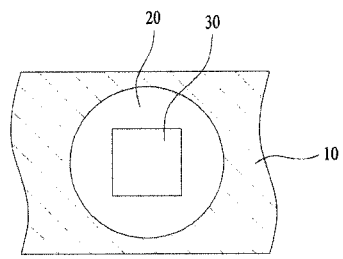
[FIG. 2c]
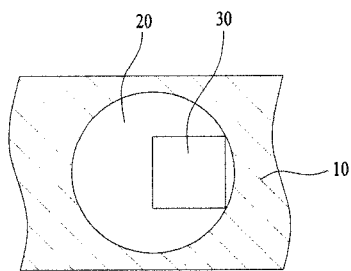

[FIG. 3a]
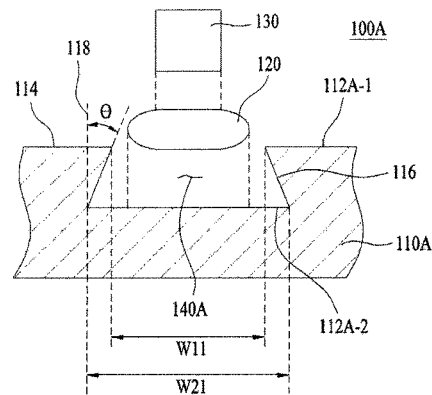
[FIG. 3b]
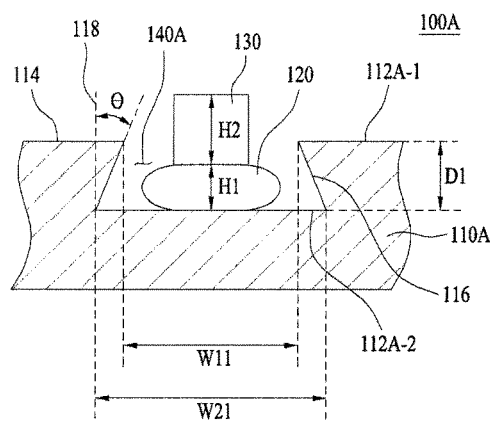
[FIG. 4a]
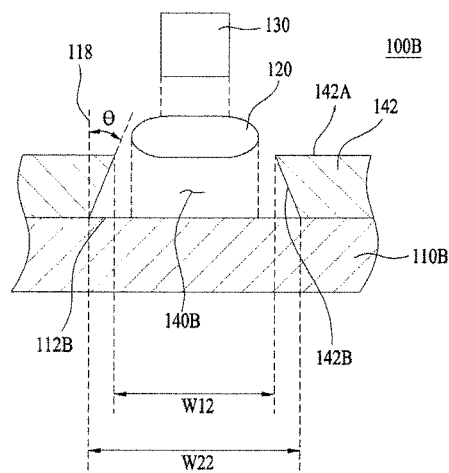

[FIG. 4b]
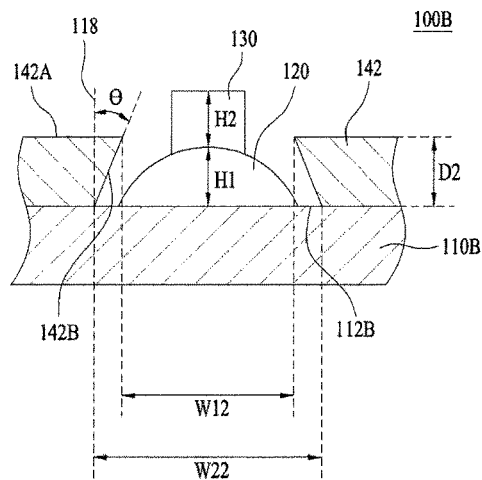
[FIG. 5]
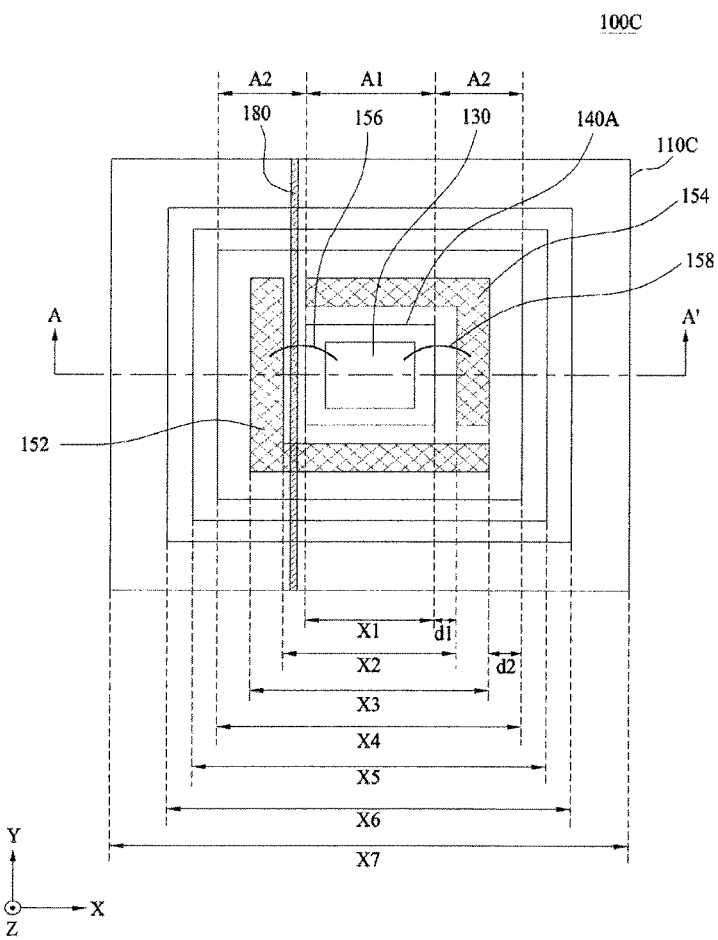

[FIG. 6]
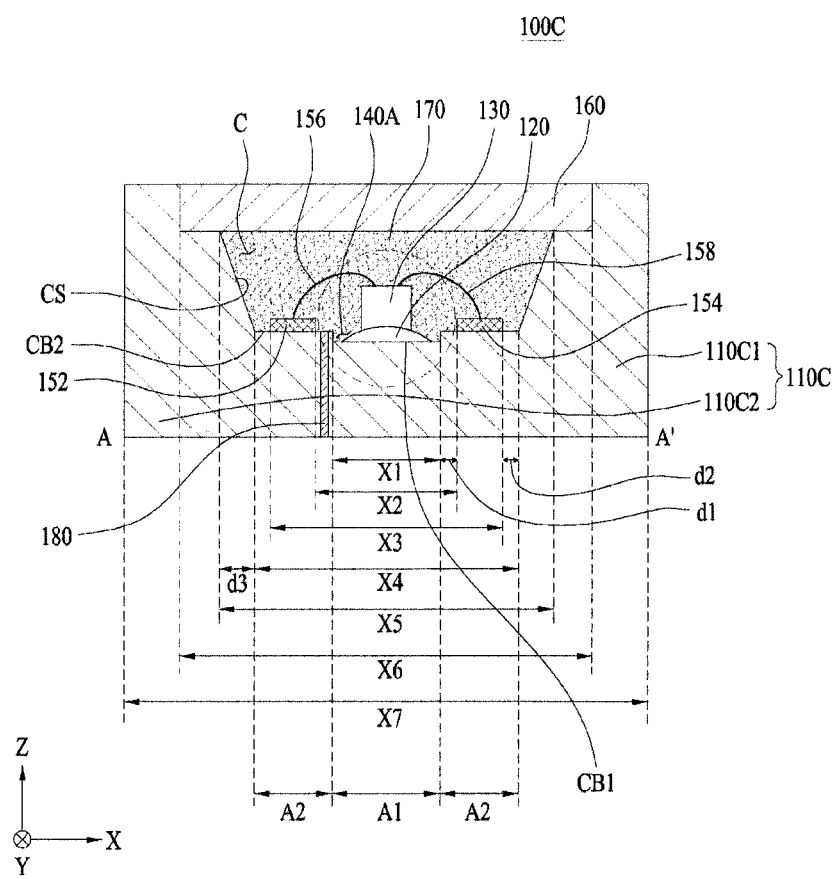

[FIG. 7]
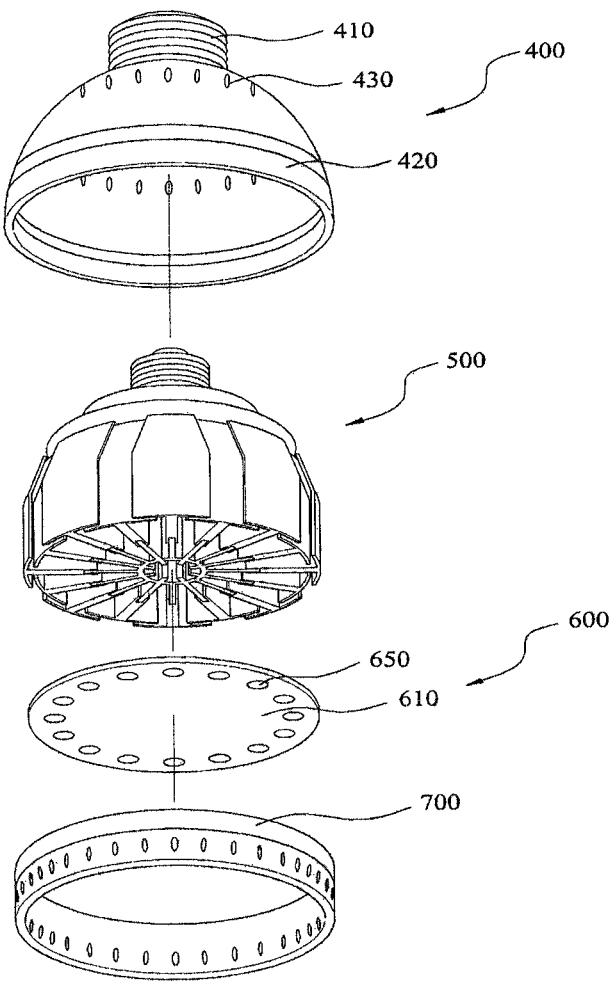

[FIG. 8]
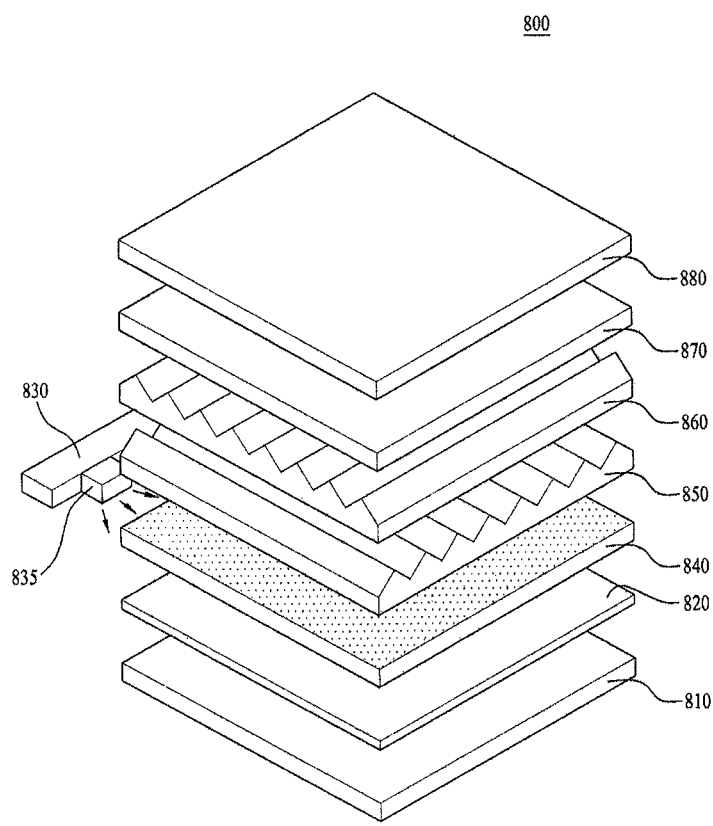

LIGHT-EMITTING DEVICE PACKAGE

CROSS REFERENCE TO RELATED APPLICATIONS

This application is the National Phase of PCT/KR2015/005690 filed on Jun. 8, 2015, which claims priority under 35 U.S.C. § 119(a) to Patent Application No. 10-2014-0074102 filed in the Republic of Korea on Jun. 18, 2014, all of which are hereby expressly incorporated by reference into the present application.

TECHNICAL FIELD

Embodiments relate to a light-emitting device package.

BACKGROUND ART

Red, green and blue Light-Emitting Diodes (LEDs), which may realize very bright white light, have been developed based on the development of, for example, a gallium nitride (GaN) metal organic chemical vapor deposition method and a molecular beam growth method.

These LEDs substitute for conventional light sources because they include no environmentally noxious materials, such as mercury (Hg), which are used in conventional lighting appliances, such as, for example, incandescent lamps and fluorescent lamps, thus being very environmentally friendly, and also have several advantages, such as, for example, a long lifespan and low power consumption. The salient competitiveness of the LEDs is to realize high brightness through high-efficiency and high-output chip and packaging technologies.

FIG. 1 is a schematic sectional view of a conventional light-emitting device package, which includes a package body 10, an adhesive layer 20, and an LED 30.

Referring to FIG. 1, when the LED 30 is formed via stamping after the adhesive layer 20, which is in paste form, is formed on the package body 10, the adhesive layer 20 is disposed between the LED 30 and the package body 10, thereby causing the two 30 and 10 to be coupled to each other.

FIGS. 2a to 2c are different plan views of the light-emitting device package illustrated in FIG. 1.

When stamping the LED 30, the adhesive layer 20 is in the form of a paste, thus showing various plan shapes depending on the viscosity thereof. In the normal case, the plan shape of the adhesive layer 20 around the LED 30 is as illustrated in FIG. 2a. However, the adhesive layer 20 may widely spread in the radial direction around the LED 30, as illustrated in FIG. 2b. Alternatively, the adhesive layer 20 may widely spread in only a direction around the LED 30. As described above, when the LED 30 is bonded to the package body 10 via stamping, it may be difficult to minimize or control the spreading of the paste-type adhesive layer 20.

In the case where the paste-type adhesive layer 20 spreads abnormally widely, as illustrated in FIG. 2b or 2c, the adhesive layer 20 may be discolored by deep ultraviolet light, which is emitted from the LED 30 and is in a wavelength band within a range from 270 nm to 285 nm. At this time, the discolored adhesive layer 20 may absorb a great quantity of light, thus suffering from low light emission efficiency and poor heat dissipation. In particular, when the discolored adhesive layer 20 is subsequently decomposed, micro cracks, etc. may form, which may reduce the lifespan of the light-emitting device package by allowing moisture to permeate therein.

DISCLOSURE

Technical Problem

Embodiments provide a light-emitting device package having enhanced luminous efficacy, enhanced heat dissipation, and an extended lifespan.

Technical Solution

An embodiment provides a light-emitting device package including a package body, at least one light-emitting device above the package body, an adhesive layer for bonding the at least one light-emitting device to the package body, and an adhesive-layer-accommodating portion formed in the package body for accommodating the adhesive layer therein, wherein the adhesive-layer-accommodating portion has a side surface formed to be inclined at a predetermined angle relative to an imaginary vertical plane that extends in a thickness direction of the package body. For example, the predetermined angle may be equal to or greater than 0 degrees and may be equal to or less than 45 degrees.

The package body may include a cavity, and the at least one light-emitting device, the adhesive layer, and the adhesive-layer-accommodating portion are located in the cavity.

The adhesive layer may include at least one of Ag paste or Au paste.

The package body may be formed of an electrically insulative material. The adhesive-layer-accommodating portion may be formed separately from the package body.

The package body may be formed of an electrically conductive material. The adhesive-layer-accommodating portion may be integrally formed with the package body.

The adhesive-layer-accommodating portion may include a dam portion disposed on an upper surface of the package body so as to define a space for accommodating the adhesive layer therein. The dam portion and the package body may be formed of the same material, or different materials.

The adhesive-layer-accommodating portion may be formed in the shape of a recess in a top of the package body.

The adhesive-layer-accommodating portion may have a depth that is equal to or greater than a height of the adhesive layer, and a result of subtracting the height of the adhesive layer from the depth of the adhesive-layer-accommodating portion may be equal to or less than 0.25 times a height of the at least one light-emitting device.

The at least one light-emitting device may emit light in a wavelength band within a range from 200 nm to 405 nm.

The adhesive-layer-accommodating portion may have a circular, elliptical or polygonal plan shape.

The light-emitting device package may further include first and second wire bonding pads disposed to be spaced apart from each other around the adhesive-layer-accommodating portion, and first and second wires for connecting first and second electrodes of the at least one light-emitting device and the first and second wire bonding pads to each other respectively.

The adhesive-layer-accommodating portion and the first and second wire bonding pads may be spaced apart from each other by a first distance, and the first and second wire bonding pads and a side surface of the cavity may be spaced apart from each other by a second distance.

The adhesive-layer-accommodating portion may include a bottom surface, and the side surface extending from the bottom surface, wherein the side surface may have a first width at a top side thereof, and the first width may be smaller than a second width at a bottom side of the side surface.

The package body may include first and second body portions, and the light-emitting device package may further include an insulator for electrically insulating the first and second body portions.

The adhesive layer may have a paste form.

Advantageous Effects

In a light-emitting device package according to an embodiment, because an adhesive layer is accommodated in an adhesive-layer-accommodating portion, the radius that the adhesive layer spreads may be minimized when a light-emitting device and a package body are bonded to each other, which may reduce the absorption of light by the adhesive layer, resulting in enhanced luminous efficacy and enhanced heat dissipation. In addition, even if light in a wavelength band of deep ultraviolet light is emitted from the light-emitting device, discoloration and decomposition of the adhesive layer may be prevented, which may increase the lifespan of the light-emitting device package.

DESCRIPTION OF DRAWINGS

FIG. 1 is a schematic sectional view of a conventional light-emitting device package.

FIGS. 2a to 2c are different plan views of the light-emitting device package illustrated in FIG. 1.

FIGS. 3a and 3b are, respectively, an exploded sectional view and a coupled sectional view of a light-emitting device package according to one embodiment.

FIGS. 4a and 4b are an exploded sectional view and a coupled sectional view of a light-emitting device package according to another embodiment.

FIG. 5 is a plan view of a light-emitting device package according to a further embodiment.

FIG. 6 is a sectional view taken along line A-A' of FIG. 5.

FIG. 7 is an exploded perspective view illustrating an embodiment of a lighting apparatus including the light-emitting device package according to the embodiments.

FIG. 8 is an exploded perspective view illustrating an embodiment of a display apparatus including the light-emitting device package according to the embodiments.

BEST MODE

Hereinafter, embodiments will be described in detail with reference to the accompanying drawings, in order to concretely describe the disclosure and to assist the understanding of the disclosure. However, the embodiments disclosed here may be altered in various other forms, and the scope of the disclosure should not be construed as limited to the embodiments. The embodiments disclosed here are provided in order to more perfectly describe the disclosure to those of ordinary skill in the art.

In the description of the embodiments disclosed here, it will be understood that, when an element is referred to as being formed "on" or "under" another element, it can be directly "on" or "under" the other element or be indirectly formed with intervening one or more elements therebetween. It will also be understood that "on" or "under" the element may be described relative to the drawings.

In addition, relative terms such as, for example, "first", "second", "on/upper/above" and "beneath/lower/below", used in the following description may be used to distinguish any one substance or element with another substance or element without requiring or containing any physical or logical relationship or sequence between these substances or elements.

In the drawings, the thickness or size of each layer may be exaggerated, omitted or schematically illustrated for clarity and convenience. In addition, the size of each constituent element does not entirely reflect an actual size thereof.

FIGS. 3a and 3b are, respectively, an exploded sectional view and a coupled sectional view of a light-emitting device package 100A according to one embodiment.

The light-emitting device package 100A illustrated in FIGS. 3a and 3b includes a package body 110A, an adhesive layer 120, and a light-emitting device 130.

The light-emitting device 130 is disposed on the package body 110A.

The package body 110A may be formed of an electrically insulative material or an electrically conductive material. For example, the package body 110A may include a metal material that radiates heat and is electrically conductive, such as aluminum. Alternatively, the package body 110A may include at least one of $Si_xO_y$, $Si_xN_y$, $Al_2O_3$, or AlN. For example, the package body 110A may be formed of electrically insulative ceramic, such as Low-Temperature Cofired Ceramic (LTCC) or High-Temperature Cofired Ceramic (HTCC). Here, the package body 110A, which is bonded to the light-emitting device 130 via the adhesive layer 120, may be a die-bonding pad.

The light-emitting device 130 may be bonded to the package body 110A via the adhesive layer 120. To this end, the adhesive layer 120 may be of a paste type, and may include, for example, at least one of Ag or Au.

In addition, the embodiment is not limited as to the bonding shape of the light-emitting device 130. That is, the light-emitting device 130 may have a vertical bonding structure, a horizontal bonding structure, or a flip bonding structure.

The light-emitting device 130 may be a side-view-type light-emitting diode or a top-view-type light-emitting diode.

In addition, the light-emitting diode 130 may be configured as a blue LED or ultraviolet LED, or may be configured in the form of a package including at least one selected from among a red LED, a green LED, a blue LED, a yellow green LED, and a white LED, or combinations of two or more thereof.

Meanwhile, an adhesive-layer-accommodating portion 140A, as illustrated in FIG. 3a, may be formed in the package body 110A, thus having a shape that accommodates the adhesive layer 120 therein, as illustrated in FIG. 3.

FIGS. 4a and 4b are an exploded sectional view and a coupled sectional view of a light-emitting device package 100B according to another embodiment.

The light-emitting device package 100B illustrated in FIGS. 4a and 4b includes a package body 110B, the adhesive layer 120, and the light-emitting device 130. Here, the adhesive layer 120 and the light-emitting device 130 correspond to the adhesive layer 120 and the light-emitting device 130 illustrated in FIGS. 3a and 3b, respectively, and thus are designated by the same reference numerals, and a repeated description thereof is omitted.

In the case of the light-emitting device package 100A illustrated in FIGS. 3a and 3b, the adhesive-layer-accommodating portion 140A may be formed in the shape of a recess in the top of the package body 110A. That is, the package body 110A has stepped upper surfaces 112a-1 and 112a-2 that define the space in the adhesive-layer-accommodating portion 140A.

On the other hand, in the case of the light-emitting device package 100B illustrated in FIGS. 4a and 4b, an adhesive-layer-accommodating portion 140E includes a dam portion 142. The dam portion 142 is disposed on an upper surface 112b of the package body 110B to define a space in the adhesive-layer-accommodating portion 140B in which the adhesive layer 120 may be accommodated. In this case, unlike the illustration of FIGS. 3a and 3b in which the package body 110A has the stepped upper surfaces 112a-1 and 112a-2, the upper surface 112b of the package body 110E is flat. As such, excluding the difference in the structure of the top of the package body, the package body 110B illustrated in FIGS. 4a and 4b has the same properties as the package body 110A illustrated in FIGS. 3a and 3b. In addition, although the shape of the adhesive layer 120 illustrated in FIG. 4b is illustrated as being different from the shape of the adhesive layer 120 illustrated in FIG. 3b, the embodiment is not limited thereto. That is, the shape of the adhesive layer 120 illustrated in FIG. 4b may be the same as the shape of the adhesive layer 120 illustrated in FIG. 3b.

The adhesive-layer-accommodating portion 140A may be integrally formed with the package body 110A, as illustrated in FIGS. 3a and 3b. Alternatively, the adhesive-layer-accommodating portion 140B may be formed separately from the package body 110B, as illustrated in FIGS. 4a and 4b.

In FIGS. 4a and 4b, the dam portion 142 and the package body 110E may include the same material, or may include different materials.

When the package body is formed of an electrically conductive material, as illustrated in FIGS. 3a and 3b, the adhesive-layer-accommodating portion 140A may be integrally formed with the package body 110A. This is because, when the package body 110A is formed of an electrically conductive metal, the metal may ensure the easy formation of a recess.

In addition, when the package body is formed of an electrically insulative material, as illustrated in FIGS. 4a and 4b, although the adhesive-layer-accommodating portion 140B may be formed using the dam portion 142, which is separate from the package body 110B, the embodiment is not limited thereto.

Referring to FIGS. 3a and 3b, when the depth D1 of the adhesive-layer-accommodating portion 140A is smaller than the first height H1 of the adhesive layer 120, the adhesive layer 120 may not be entirely accommodated in the adhesive-layer-accommodating portion 140A. In this case, the residue of the adhesive layer 120, which may not be accommodated in the adhesive-layer-accommodating portion 140A, may run over the adhesive-layer-accommodating portion 140A onto the upper surface 112a-1 of the package body 110A.

In addition, referring to FIGS. 4a and 4b, when the depth D2 of the adhesive-layer-accommodating portion 140E is smaller than the first height H1 of the adhesive layer 120, the adhesive layer 120 may not be entirely accommodated in the adhesive-layer-accommodating portion 140B. In this case, the residue of the adhesive layer 120, which may not be accommodated in the adhesive-layer-accommodating portion 140B, may run over the adhesive-layer-accommodating portion 140B onto an upper surface 142a of the dam portion 142.

In addition, when a value acquired by subtracting the first height H1 from the depth D1 or D2 of the adhesive-layer-accommodating portion 140A or 140E is greater than 0.25 times the second height H2 of the light-emitting device 130, light emitted from the light-emitting device 130 may be introduced into the adhesive-layer-accommodating portion 140A or 140B to thereby dissipate, which may deteriorate the light extraction efficacy of the entire light-emitting device package 100A or 100B.

In consideration of the above description, although the depth D1 or D2 of the adhesive-layer-accommodating portion 140A or 140B may be equal to or greater than the first height H1, and a value acquired by subtracting the first height H1 from the depth D1 or D2 may be equal to or less than 0.25 times the second height H2, the embodiment is not limited thereto.

In addition, the adhesive-layer-accommodating portion 140A illustrated in FIGS. 3a and 3b may include the bottom surface 112a-2 and a side surface 116 extending from the bottom surface 112a-2. At this time, a first-first width W11 at the top side of the side surface 116 may be smaller than a second-first width W21 at the bottom side of the side surface 116. That is, the side surface 116 may be formed to be inclined at a predetermined angle ⊖ relative to an imaginary vertical plane 118 extending in the thickness direction of the package body 110A, In addition, the adhesive-layer-accommodating portion 140E illustrated in FIGS. 4a and 4b may include the bottom surface 112b and a side surface 142b of the dam portion 142 extending from the bottom surface 112b. At this time, a first-second width W12 at the top side of the side surface 142b may be smaller than a second-second width W22 at the bottom side of the side surface 142b. That is, the side surface 142b may be formed to be inclined at a predetermined angle e relative to the imaginary vertical plane 118 extending in the thickness direction of the package body 110B.

The above-described predetermined angle ⊖ may be 0 degrees or more and 45 degrees or less.

As described above, in the case where the first-first width W11 (or the first-second width W12) at the top side of the side surface 116 or 142b, which corresponds to an opening of the adhesive-layer-accommodating portion 140A or 140B, is smaller than the second-first width W21 (or the second-second width W22), when the adhesive layer 120 is compressed at, for example, a force of 50 gf or 100 gf, by the light-emitting device 130 via stamping, the adhesive layer 120 may have difficulty in running over the adhesive-layer-accommodating portion 140A or 140B. This may ensure that the adhesive layer 120 is reliably accommodated in the adhesive-layer-accommodating portion 140A or 140B.

Hereinafter, a light-emitting device package 100C according to a further embodiment, which includes the adhesive-layer-accommodating portion 140A illustrated in FIGS. 3a and 3b, will be described with reference to the accompanying drawings. However, the following description may of course be applied to a light-emitting device package according to a still further embodiment, which includes the adhesive-layer-accommodating portion 140B illustrated in FIGS. 4a and 4b.

FIG. 5 is a plan view of the light-emitting device package 100C according to a further embodiment, and FIG. 6 is a sectional view taken along line A-A' of FIG. 5. For convenience of description, a light-transmitting member 160 and a molding member 170 illustrated in FIG. 6 are omitted in FIG. 5. Although the coordinate system illustrated in FIGS. 5 and 6 is the Cartesian coordinate system, the embodiment may of course be described using other coordinate systems.

Referring to FIGS. 5 and 6, the light-emitting device package 100C according to a further embodiment includes a package body 1100, the adhesive layer 120, the light-emitting device 130, first and second wire bonding pads 152 and 154, first and second wires 156 and 158, the light-transmitting member 160, and the molding member 170.

The adhesive layer 120 and the light-emitting device 130 illustrated in FIGS. 5 and 6 respectively correspond to the adhesive layer 120 and the light-emitting device 130 illustrated in FIGS. 3a and 3b, and thus are designated by the same reference numerals, and a repeated description thereof is omitted.

Although the package body 110C illustrated in FIGS. 5 and 6 may include a cavity C, the embodiment is not limited thereto. When the package body 110C includes the cavity C as illustrated in FIGS. 5 and 6, the adhesive layer 120, the light-emitting device 130, and the adhesive-layer-accommodating portion 140A are placed inside the cavity C. However, unlike the illustration of FIGS. 5 and 6, even when the package body includes no cavity, the adhesive layer 120, the light-emitting device 130, and the adhesive-layer-accommodating portion 140A may of course be disposed in the top of the package body 110A as illustrated in FIGS. 3a and 3b.

Referring again to FIGS. 5 and 6, the package body 1100 including the cavity C may be divided into a first area A1 and a second area A2, which are adjacent to each other in the direction (the X-axis direction) that is perpendicular to the thickness direction (the Z-axis direction) of the package body 110C. At this time, in the first area A1, a first bottom surface CB1 (or a first lower surface) CB1 of the cavity C, i.e. the upper surface of the package body 110C is bonded to the light-emitting device 130 via the adhesive layer 120. At this time, the adhesive-layer-accommodating portion 140A is formed in the shape of a recess in the top of the first area A1 of the package body 110C, and serves to accommodate the adhesive layer 120 therein.

As such, with the exception that the cavity C is formed in the package body 110C, the package body 1100 illustrated in FIGS. 5 and 6 is the same as the package body 110A illustrated in FIGS. 3a and 3b, and thus a repeated description thereof is omitted.

When the wavelength band of light emitted from the light-emitting device 130 is an ultraviolet light wavelength band within a range from 200 nm to 405 nm, in order to increase heat radiation efficiency, the package body 110C may be formed of a material having thermal conductivity and electrical conductivity. In this case, the light-emitting device package 100C may further include an insulator 180, and the package body 110C may include first and second body portions 110C1 and 110C2. In addition, the first and second body portions 110C1 and 110C2 are electrically insulated from each other by the insulator 180. However, when the package body 110C is formed of an electrically insulative material, the insulator 180 illustrated in FIGS. 5 and 6 is omitted.

In addition, referring to FIG. 5, although the adhesive-layer-accommodating portion 140A has a square plan shape, the embodiment is not limited thereto. That is, according to another embodiment, the adhesive-layer-accommodating portion 140A may have any other shape, including polygonal, circular, or elliptical plan shapes, instead of the square plan shape.

In addition, the first and second wire bonding pads 152 and 154 are disposed to be electrically spaced apart from each other around the periphery of the adhesive-layer-accommodating portion 140A. For example, although the first wire bonding pad 152 is a pad that is allotted for a positive (+) pole of the light-emitting device 130 and the second wire bonding pad 154 is a pad that is allotted for a negative (−) pole of the light-emitting device 130, the embodiment is not limited thereto, and may have the reverse configuration.

First and second electrodes (not illustrated) of the light-emitting device 130 may be electrically connected to the first and second wire bonding pads 152 and 154 via the first and second wires 156 and 158 respectively.

In addition, the adhesive-layer-accommodating portion 140A may be spaced apart from the first and second wire bonding pads 152 and 154 by a first distance d1, and the side surface CS of the cavity C may be spaced apart from the first and second wire bonding pads 152 and 154 by a second distance d2. At this time, the first distance d1 may be determined in consideration of the tolerance of a process of forming the adhesive-layer-accommodating portion 140A.

Referring to FIGS. 5 and 6, the width of the adhesive-layer-accommodating portion 140A formed in the first area A1 of the package body 1100 may be "X1", the width including the adhesive-layer-accommodating portion 140A and the first distance d1 may be "X2", the width including the adhesive-layer-accommodating portion 140A, the first distance d1 and the first and second wire bonding pads 152 and 154 may be "X3", the overall width of the first and second bottom surfaces CB1 and CB2 of the cavity C, which are formed respectively in the first and second areas A1 and A2 of the package body 110C, may be "X4", the width including the first and second bottom surfaces CB1 and CB2 of the cavity C and the side surface CS may be "X5", the width including the width X5 of the cavity C and the upper surface of the package body 110C on which the light-transmitting member 160 is disposed may be "X6", and the width of the entire package body 110C may be "X7". Here, the width d3 of the side surface CS of the cavity C may be "zero" or more.

Meanwhile, the light-transmitting member 160 may cover the top of the cavity C, and may transmit light emitted from at least one light-emitting device 130 in the vertical direction (in the Z-axis direction). To this end, the light-transmitting member 160 may be formed of a transparent material to enable the transmission of the light emitted from the light-emitting device 130. For example, although the light-transmitting member 160 may be formed of, for example, quartz or sapphire, the embodiment is not limited as to the constituent material of the light-transmitting member 160.

In addition, although the light-transmitting member 160 may have a flat plate shape, as illustrated in FIG. 6, the embodiment is not limited thereto. That is, according to another embodiment, the light-transmitting member 160 may have a semispherical or spherical shape. In addition, the light-transmitting member 160 may include a flat sheet, a semispherical lens, or a spherical lens.

The molding member 170 is located in the cavity C so as to encircle the at least one light-emitting device 130. In addition, the molding member 170 may include a phosphor in order to change the wavelength of the light emitted from the light-emitting device 130. For example, when the light-emitting device 130 emits blue light and the molding member 170 includes a yellow phosphor, white light may be emitted to the top of the light-transmitting member 160. Alternatively, when the light-emitting device 130 emits blue light and the molding member 170 includes a red phosphor and a green phosphor, white light may be emitted to the top of the light-transmitting member 160. Alternatively, when the light-emitting device 130 emits blue light and the molding member 170 includes a yellow phosphor, a red phosphor and a green phosphor, white light may be emitted to the top of the light-transmitting member 160.

In some cases, the inside of the cavity C may be in a vacuum state, rather than being filled with the molding member 170.

A plurality of light-emitting device packages according to the embodiments may form an array on a board, and optical members, such as, for example, a light guide plate, a prism sheet, and a diffuser sheet, may be arranged on the optical path of the light-emitting device packages. The light-emitting device packages, the board, and the optical members may function as a light unit. According to a further embodiment, a display apparatus, an indicator apparatus, and a lighting system including the light-emitting device packages disclosed in the above-described embodiments may be realized. For example, the lighting system may include a lamp or a street light.

FIG. 7 is an exploded perspective view illustrating an embodiment of a lighting apparatus including the light-emitting device packages according to the embodiments.

The lighting apparatus according to the embodiment includes a light-emitting module 600 for projecting light, a housing 400 in which the light-emitting module 600 is accommodated, a radiator 500 for radiating heat from the light-emitting module 600, and a holder 700 for coupling the light-emitting module 600 and the radiator 500 to the housing 400.

The housing 400 includes a socket-coupling portion 410, which is coupled to an electric socket (not illustrated), and a body portion 420, which is connected to the socket-coupling portion 410 and accommodates the light source 600 therein. The body portion 420 may have one airflow through-hole 430 therein.

A plurality of airflow through-holes 430 may be formed in the body portion 420 of the housing 400. That is, one airflow through-hole 430 may be provided, a plurality of airflow through-holes 430 may be radially arranged as shown, or various other arrangements may be possible.

The light-emitting module 600 includes a plurality of light-emitting device packages 650 arranged on a circuit board 610. The light-emitting device packages 650 may include the light-emitting device packages 100A, 100B or 100C according to the above-described embodiments. The circuit board 610 may be shaped so as to be inserted into an opening in the housing 400, and may be formed of a highly thermally conductive material in order to transfer heat to the radiator 500 as will be described below.

The holder 700 may be provided below the light-emitting module, and may include a frame and another airflow through-hole. In addition, although not illustrated, an optical member may be provided below the light-emitting module 600 so as to diffuse, scatter or converge light projected from the light-emitting device module 650 of the light-emitting module 600.

FIG. 8 is an exploded perspective view illustrating an embodiment of a display apparatus 800 including the light-emitting device packages according to the embodiments.

Referring to FIG. 8, the display apparatus 800 according to the embodiment includes a light-emitting module 830 and 835, a reflector 820 on a bottom cover 810, a light guide plate 840 located in front of the reflector 820 for guiding light emitted from the light-emitting module to the front side of the display apparatus, a first prism sheet 850 and a second prism sheet 860 located in front of the light guide plate 840, a panel 870 located in front of the second prism sheet 860, and a color filter 880 located in front of the panel 870.

The light-emitting module includes a light-emitting device package 835 described above, which is placed on a circuit board 830. Here, the circuit board 830 may be, for example, a Printed Circuit Board (PCB), and the light-emitting device package 835 may be the above-described light-emitting device package 100A, 100B or 100C.

The bottom cover 810 may accommodate constituent elements inside the display apparatus 800. The reflector 820 may be provided as a separate element as illustrated in FIG. 8, or may be formed by coating the back surface of the light guide plate 840 or the front surface of the bottom cover 810 with a highly reflective material.

Here, the reflector 820 may be formed of a material that has high reflectance and may be used in an ultra thin form. The reflector 820 may be formed of polyethylene terephthalate (PET).

The light guide plate 840 scatters light emitted from the light-emitting device package module, thus causing the light to be uniformly distributed throughout the overall area of the screen of a liquid crystal display apparatus. Accordingly, the light guide plate 840 may be formed of a material that has a high index of refraction and a high transmittance. The light guide plate 840 may be formed of, for example, polymethylmethacrylate (PMMA), polycarbonate (PC) or polyethylene (PE). In addition, the light guide plate may be omitted and an air guide structure for transmitting light in the space above the reflective sheet 820 may be possible.

The first prism sheet 850 is formed on one surface of a support film using an elastic polymer material having light transmittance. The polymer material may include a prism layer in which a plurality of stereoscopic structures is repeatedly formed. Here, the multiple patterns, as illustrated, may be arranged in stripes in which valleys and ridges are repeated.

The direction in which ridges and valleys are formed on one surface of a support film in the second prism sheet 860 may be perpendicular to the direction in which the ridges and valleys are formed on one surface of the support film in the first prism sheet 850. This serves to uniformly distribute the light transmitted from the light-emitting module and the reflective sheet to the panel 870 in all directions.

In the embodiment, the first prism sheet 850 and the second prism sheet 860 form an optical sheet. The optical sheet may be any of different combinations, for example, a micro-lens array, a combination of a diffuser sheet and a micro-lens array, or a combination of a single prism sheet and a micro-lens array.

The panel 870 may include a liquid crystal display panel, or a different kind of display apparatus requiring a light source except for the liquid crystal display panel 860.

The panel 870 is configured such that liquid crystals are located between glass bodies, and in order to use the deflection of light, a polarizer is disposed on both the glass bodies. Here, the properties of the liquid crystals are intermediate to those of a liquid and a solid, and the liquid crystals, which are organic molecules having fluidity like liquid, are regularly arranged like crystals, and display an image using the arrangement of molecules, which is changed by an external electric field.

The liquid crystal display panel used in the display apparatus is of an active-matrix type, and uses a transistor as a switch that adjusts the voltage to be supplied to each pixel.

The color filter 880 may be provided on the front surface of the panel 870, and may show an image from the light that has passed through the panel 870 because respective pixels transmit only red, green and blue light.

Although the exemplary embodiments have been illustrated and described as above, it will of course be apparent to those skilled in the art that the embodiments are provided to assist understanding and the embodiments are not limited to the above description, and various modifications and variations can be made in the embodiments without departing from the spirit or scope of the disclosure, and the modifications and variations should not be understood individually from the viewpoint or scope of the disclosure so long as they include the constituent elements set forth in the claims.

Mode for Invention

Embodiments for implementation of this disclosure have sufficiently described in the above "Best Mode".

Industrial Applicability

A light-emitting device package according to the above-described embodiments may be applied to various fields, such as, for example, a display apparatus, an indicator apparatus, or a lighting system such as a lamp or a street lamp.

The invention claimed is:

1. A light-emitting device package, comprising:
a package body;
at least one light-emitting device in the package body;
an adhesive layer between the at least one light-emitting device and the package body, wherein an adhesive-layer-accommodating portion is formed in the package body for accommodating the adhesive layer therein;
first and second wire bonding pads disposed to be spaced apart from each other around the adhesive-layer-accommodating portion; and
first and second wires connecting first and second electrodes of the at least one light-emitting device and the first and second wire bonding pads to each other respectively,
wherein a cross section of the adhesive-layer-accommodating portion comprises:
a bottom surface; and
side surfaces extending from the bottom surface, the side surfaces being disposed to be inclined at an acute angle with respect to a plane including an optical axis,
wherein the adhesive-layer-accommodating portion includes an opening having a first width at a top side thereof,
wherein the first width is smaller than a second width of the bottom surface, and
wherein the package body includes a cavity, and the at least one light-emitting device, the adhesive layer, and the adhesive-layer-accommodating portion are located in the cavity.

2. The package according to claim 1, wherein the adhesive layer includes at least one of Ag paste or Au paste.

3. The package according to claim 1, wherein the package body is formed of an electrically conductive material.

4. The package according to claim 3, wherein the adhesive-layer-accommodating portion is integrally formed with the package body.

5. The package according to claim 4, wherein the adhesive-layer-accommodating portion is formed in the shape of a recess in a top of the package body.

6. The package according to claim 3, wherein the at least one light-emitting device emits light in a wavelength band within a range from 200 nm to 405 nm.

7. The package according to claim 3, wherein the package body includes first and second body portions, and
wherein the light-emitting device package further comprises an insulator for electrically insulating the first and second body portions.

8. The package according to claim 1, wherein the adhesive-layer-accommodating portion has a depth that is equal to or greater than a height of the adhesive layer, and a result of subtracting the height of the adhesive layer from the depth of the adhesive-layer-accommodating portion is equal to or less than 0.25 times a height of the at least one light-emitting device.

9. The package according to claim 1, wherein the adhesive-layer-accommodating portion has a circular, elliptical or polygonal plan shape.

10. The package according to claim 1, wherein the adhesive-layer-accommodating portion and the first and second wire bonding pads are spaced apart from each other by a first distance, and the first and second wire bonding pads and a side surface of the cavity are spaced apart from each other by a second distance.

11. The package according to claim 1, wherein the acute angle is equal to or less than 45 degrees.

12. The package according to claim 1, wherein the adhesive layer has a paste form.

13. The package according to claim 1, further comprising a molding member filled in the cavity.

14. A light-emitting device package, comprising:
a package body;
at least one light-emitting device above the package body;
an adhesive layer between the at least one light-emitting device and the package body;
a dam portion disposed on an upper surface of the package body to form an adhesive-layer-accommodating portion, the adhesive-layer-accommodating portion accommodating the adhesive layer therein;
first and second wire bonding pads disposed to be spaced apart from each other around the adhesive-layer-accommodating portion; and
first and second wires connecting first and second electrodes of the at least one light-emitting device and the first and second wire bonding pads to each other respectively,
wherein a cross section of the adhesive-layer-accommodating portion comprises:
a bottom surface being the upper surface of the package body; and
side surfaces extending from the bottom surface, the side surfaces being disposed to be inclined at an acute angle with respect to a plane including an optical axis,
wherein the adhesive-layer-accommodating portion includes an opening having a first width at a top side thereof,
wherein the first width is smaller than a second width of the bottom surface, and
wherein the package body includes a cavity, and the at least one light-emitting device, the adhesive layer, and the adhesive-layer-accommodating portion are located in the cavity.

15. The package according to claim 14, wherein the dam portion and the package body are formed of the same material.

16. The package according to claim 14, wherein the dam portion and the package body are formed of different materials.

17. The package according to claim 14, wherein the package body is formed of an electrically insulative material.

* * * * *